(12) United States Patent
Horiuchi et al.

(10) Patent No.: US 6,849,945 B2
(45) Date of Patent: Feb. 1, 2005

(54) MULTI-LAYERED SEMICONDUCTOR DEVICE AND METHOD FOR PRODUCING THE SAME

(75) Inventors: Michio Horiuchi, Nagano (JP); Takashi Kurihara, Nagano (JP); Shigeru Mizuno, Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 09/881,005

(22) Filed: Jun. 14, 2001

(65) Prior Publication Data

US 2001/0054756 A1 Dec. 27, 2001

(30) Foreign Application Priority Data

Jun. 21, 2000 (JP) ......................................... 2000-191090

(51) Int. Cl.[7] .............................................. H01L 23/48
(52) U.S. Cl. ......................................... 257/735; 257/736
(58) Field of Search ................................. 257/735, 736, 257/758, 777, 778, 684, 686, 678; 361/303; 438/106, 121, 411, 461, 611, 109

(56) References Cited

U.S. PATENT DOCUMENTS

| | | | | |
|---|---|---|---|---|
| 3,672,034 A | * | 6/1972 | Clark ....................... | 228/179.1 |
| 5,128,831 A | * | 7/1992 | Fox et al. .................. | 361/735 |
| 5,324,687 A | | 6/1994 | Wojnarowski ............... | 437/225 |
| 5,334,875 A | | 8/1994 | Sugano et al. .............. | 257/686 |
| 5,440,171 A | | 8/1995 | Miyano et al. ............. | 257/700 |
| 6,239,496 B1 | * | 5/2001 | Asada ........................ | 257/777 |
| 6,303,997 B1 | * | 10/2001 | Lee ............................. | 257/778 |
| 6,335,565 B1 | * | 1/2002 | Miyamoto et al. .......... | 257/686 |
| 6,469,374 B1 | * | 10/2002 | Imoto ......................... | 257/686 |
| 6,472,734 B2 | * | 10/2002 | Arakawa et al. ............ | 257/686 |
| 6,564,454 B1 | * | 5/2003 | Glenn et al. ................. | 29/852 |
| 2001/0001989 A1 | * | 5/2001 | Smith ......................... | 174/52.1 |
| 2002/0149097 A1 | * | 10/2002 | Lee et al. ................... | 257/686 |

FOREIGN PATENT DOCUMENTS

| EP | 0 413 542 | 2/1991 |
|---|---|---|
| WO | WO 99 57765 | 11/1999 |

* cited by examiner

*Primary Examiner*—Eddie Lee
*Assistant Examiner*—Douglas W. Owens
(74) *Attorney, Agent, or Firm*—Paul &Paul

(57) ABSTRACT

To minimize a size of a semiconductor device and reduce a thickness thereof as well as improve the yield and lower the production cost in the production of a semiconductor package, a multi-layered semiconductor device is provided, wherein a film-like semiconductor package (10) incorporating therein a semiconductor chip (12) is disposed in a package accommodation opening (11*a*) of a circuit pattern layer to form a circuit board. A plurality of such circuit boards are layered together to electrically connect circuit patterns (13) of the circuit boards with each other via a low melting point metal (14) or lead beam bonding (13*b*).

8 Claims, 7 Drawing Sheets

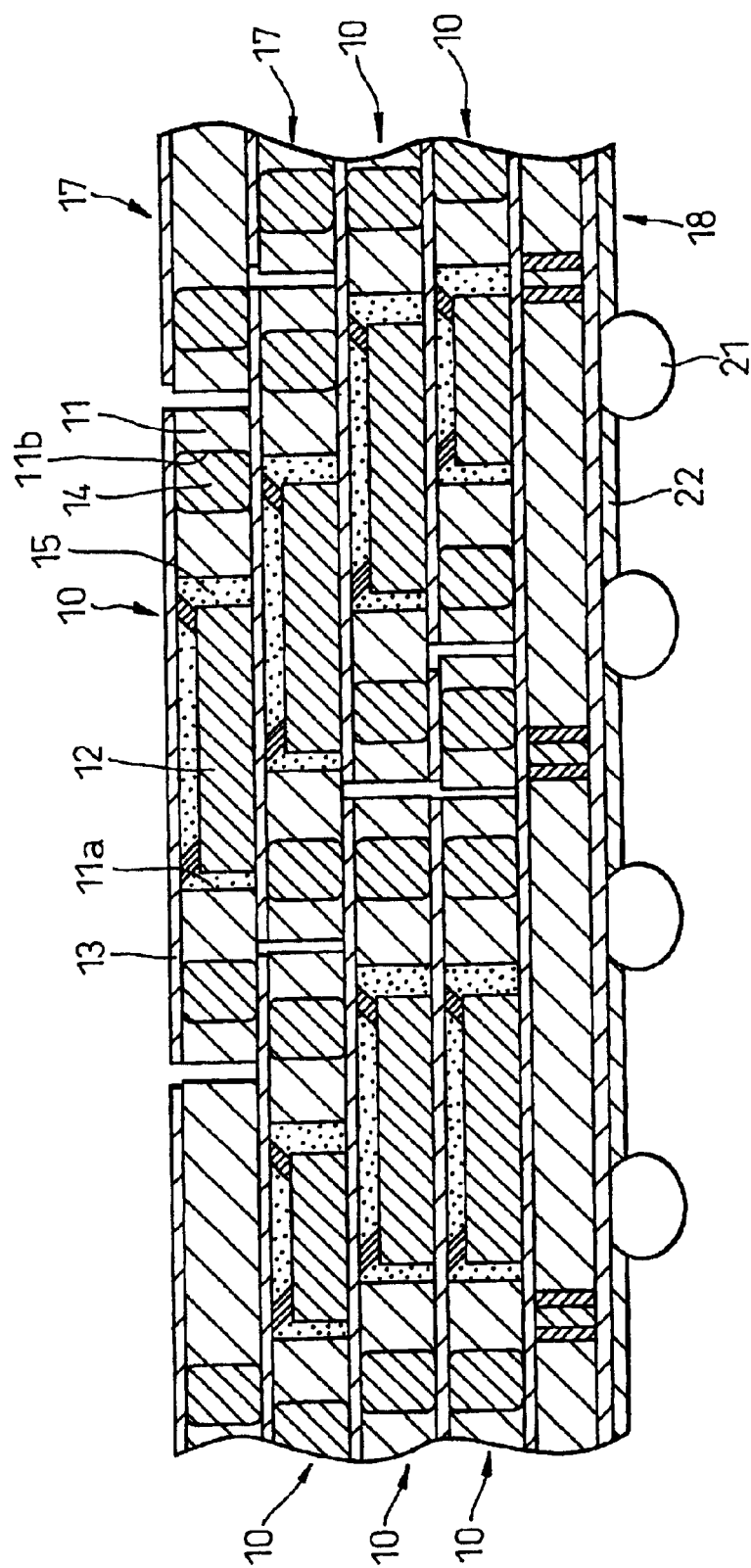

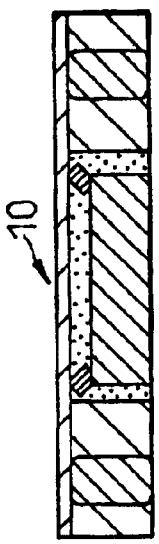
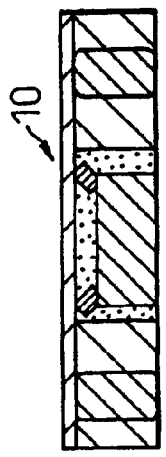
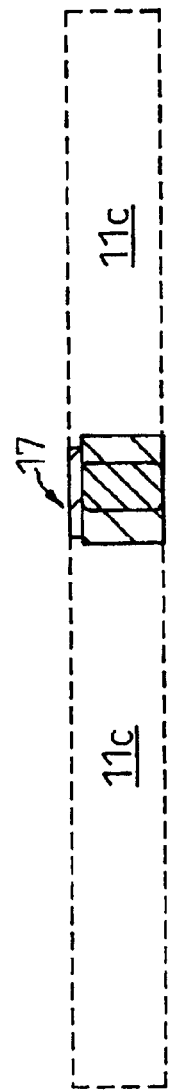
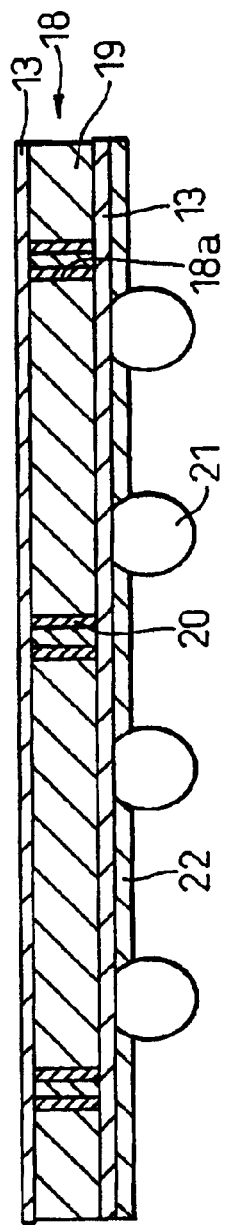
Fig.2(e)
Fig.2(f)
Fig.2(g)
Fig.2(h)

MULTI-LAYERED SEMICONDUCTOR DEVICE AND METHOD FOR PRODUCING THE SAME

BACKGROUND OF THE INVENTION

1. Field of the Invention

The present invention relates to a multi-layered semiconductor device and a method for producing the same.

2. Description of the Related Art

Various types of packages have been known in the prior art. On these packages are mounted semiconductor elements such as LSI chips and resin-shielded packages of a non-airtight type have been widely used in the market for economical and mass-production reasons. Typical examples of such a non-airtight type resin-shielded package are, for example, a plastic package and a TCP (tape carrier package). Particularly, the TCP has increasingly been used since it satisfies the recent demands on the semiconductor device and has a large number of pins, a reduced lead pitch, is thin and reduces the size of the device.

More specifically, TCP is a tape carrier type package incorporating a TAB mounting system. A wire-bonding method using minute wires of gold or aluminum for connecting the semiconductor chip to leads of the package has widely been adopted in the conventional semiconductor device. Contrary to this, TCP uses, instead of the wires, copper leads formed on a resinous film (tape). The copper leads can be formed in such a manner that, after a sheet-like adhesive is bonded to the resinous film, the film is punched with a die to form openings at a predetermined pattern and a copper foil is adhered on the film, after which unnecessary part of the copper foil is removed by an etching process. Then, the semiconductor chip is located in correspondence to the opening, and bumps (for example, of gold) formed on electrodes of the chip are bonded to the copper leads on the tape by a suitable jig to result in the target semiconductor device.

It is also desirable to provide a semiconductor package and a semiconductor device capable of producing a high-density module at a low cost and of improving a chip characteristic by minimizing the absolute distance between the chips.

FIG. 7 is a perspective view of a semiconductor device after the semiconductor chip has been connected to the leads of TCP, prior to severing the respective TCP from the tape. TCP 30 uses a resinous film (such as a polyimide resinous film) 31 as a substrate on which are formed leads 32 by etching a copper foil. On opposite sides of the resinous film 31, a plurality of sprocket holes 33 are provided for feeding the film when the assembly of the semiconductor device is sequentially carried out. In addition, as illustrated, an opening 35 (generally referred to as a "device hole") for accommodating a semiconductor chip 34 is provided in a middle portion of the resinous film 31.

The connection of the semiconductor chip with the leads of the package will be readily understood after reference to FIG. 8 which is an enlarged sectional view of the middle portion of the semiconductor device shown in FIG. 7. After the semiconductor chip 34 has been located in the device hole 35, tip ends of the respective leads 32 are connected to bumps (in general, gold-plated projections) 36 on individual electrodes of the semiconductor chip. The connection of the leads is generally carried out by a flat bonding method while using a known bonding tool. In this regard, a tip end of the copper lead 32 is plated with gold or tin prior to the bonding process for facilitating the bonding with the bump 36. Finally, although not illustrated in FIG. 7 for the purpose of simplification, an insulation resin 37 is wrapped around both of the semiconductor chip 34 and the leads 36 to shield them from the ambient humidity and contamination. The shielding insulation resin is, for example, an epoxy-type resin.

Recently, it has been desired that the semiconductor device is made smaller and thinner. Also the semiconductor chip itself is desired to be thinner. That is, while a thickness of the conventional semiconductor chip is approximately in a range from 400 to 500 $\mu$m, it is preferably in a range from 40 to 50 $\mu$m. Although the semiconductor device is preferably as thin as possible, such a thinning, as well as the control thereof, are difficult. Also, if the thickness is reduced, the shielding with resin is difficult to control.

It is also desired in such a semiconductor device or a semiconductor package used therefor that the semiconductor element and the semiconductor package are easily connected to each other at a low cost.

Further, it is also desired to provide a semiconductor package and a semiconductor device capable of producing a high-density module at a low cost and of improving electrical characteristics of elements by reducing an absolute distance between the elements.

SUMMARY OF THE INVENTION

An object of the present invention is to provide a multi-layered semiconductor device capable of contributing to the miniaturization or thinning of a semiconductor device such as a multi-chip module (MCM) incorporating a number of chips therein, as well as of improving the yield thereof.

Another object of the present invention is to provide a method for producing a high-performance and reliable multi-layered thin semiconductor device and mounting thereon a plurality of semiconductor elements.

The above-mentioned objects and other objects will be more easily understood from the following description.

A multi-layered semiconductor device according to the present invention is characterized in that a film-like semiconductor package incorporating therein a semiconductor chip is disposed in a package accommodation opening of a circuit pattern layer to form a circuit board, and a plurality of the circuit boards are layered together to electrically connect circuit patterns of the circuit boards with each other.

Every adjacent circuit board is bonded to another with an insulation adhesive except for an electrically connected portion.

The electrical connection between the circuit patterns on the respective circuit boards is performed via a low melting point metal filled in a through-hole formed in the package or the circuit board. The electrical connection between the circuit patterns on the circuit boards may be performed by connecting an extension of the circuit pattern into a hole formed in the semiconductor package or the circuit board with an electrode pad of the circuit pattern in the other circuit board positioned beneath the former circuit board (by a beam lead bonding).

The electric connection between the semiconductor package and a circuit layer of the circuit board accommodating the semiconductor package is performed by connecting an extension of the circuit pattern formed on the semiconductor package to project outside the package with an electrode pad of the circuit pattern layer (by a beam lead bonding).

A method for producing a multi-layered semiconductor device according to the present invention is characterized by the steps of separately testing a film-like semiconductor package including a semiconductor chip therein and a circuit pattern layer having an opening for accommodating the semiconductor package; forming a circuit board by disposing the semiconductor package in the opening; and superposing a plurality of the circuit boards together and electrically connecting the circuit patterns of the circuit boards with each other.

A multi-layered semiconductor device of another aspect according to the present invention is formed of a plurality of circuit boards layered together, each comprising an insulating substrate, a semiconductor chip incorporated in the substrate and a circuit formed on a surface of the substrate and connected to the semiconductor chip, characterized in that a lead extending from the circuit on the circuit board is bonded in a through-hole provided in the insulation substrate of the circuit board to a circuit on another circuit board disposed beneath the former circuit board to establish the interlayer connection.

At least one of the plurality of circuit boards incorporates a plurality of semiconductor chips therein.

Every adjacent circuit board is bonded to another with an insulating adhesive.

The semiconductor chip is accommodated in a through-hole formed in the insulating substrate of at least one of the plurality of circuit boards, and is electrically connected to the circuit of the circuit board by beam lead bonding. The semiconductor chip may be accommodated in a through-hole formed in the insulation substrate of at least one of the plurality of circuit boards, and electrically connected to the circuit of the circuit board and the semiconductor chip by a flip-chip method.

A method for producing the above-mentioned multi-layered semiconductor device is characterized in that the method comprises the steps of individually testing the circuit boards and superposing the plurality of circuit boards together.

As described above, according to the present invention, it is possible to produce, at low cost, a high-performance reliable multi-layered semiconductor device (multi-chip module) of a thin type in which semiconductor elements such as ICs are incorporated. That is, since the connection with the semiconductor chip and between substrates can be simultaneously performed by the same beam lead bonding method, the process can be simplified to enable production of the thin type multi-layered semiconductor device in a short time and at a low cost.

Also, according to the present invention, since individual semiconductor packages, connecting layers or substrates and/or circuit boards of the respective layers are tested prior to being layered together to form the multi-layered semiconductor device, it is possible to improve the yield thereof. That is, if a plurality of semiconductor chips are directly mounted to a laminated substrate or if wafers for manufacturing chips are three-dimensionally laminated as in the prior art, yields of the respective functional units are directly accumulated to lower the total yield. On the other hand, according to the present invention, the test is carried out on individual chips, packages and substrates prior to the assembly thereof to improve the total yield.

BRIEF DESCRIPTION OF THE DRAWINGS

FIG. 1 is a sectional view of a multi-layered semiconductor device according to one embodiment of the present invention;

FIGS. 2(a) to 2(h) are sectional views, respectively, of individual components consisting of the multi-layered semiconductor device shown in FIG. 1;

DETAILED DESCRIPTION OF THE INVENTION

Figure 2A:
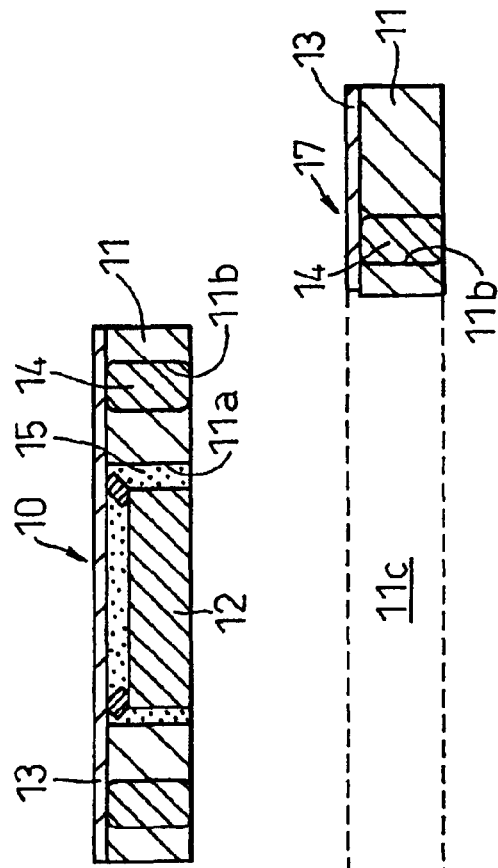

The present invention will be described in more detail below with reference to the attached drawings. In this regard, it should be understood that the embodiments illustrated are typical examples of the present invention, and various changes and modifications thereof can be made without departing from the scope of the present invention.

A film-like semiconductor package 10 includes a film-like substrate 11 of a resinous material, a semiconductor chip 12 accommodated in an opening 11a of the substrate, a circuit pattern 13 formed on a surface of the substrate, and a low melting point metal 14 filled in a through-hole 11b for electrically connecting upper and lower surfaces of the package to each other.

Figure 2B:
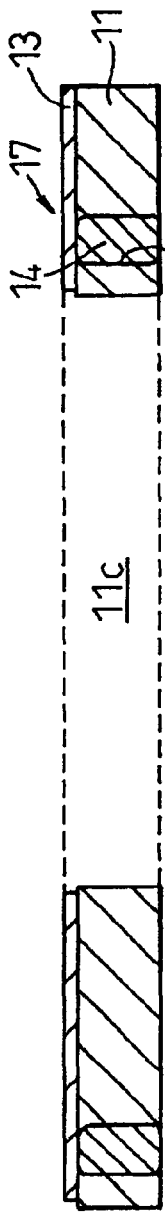

According to the semiconductor package 10 of the embodiment shown in FIG. 1 and FIGS. 2(a) to 2(b), the electric connection between the circuit pattern 13 and the semiconductor chip 12 is performed by beam lead bonding of an extension of the circuit pattern 13 into the opening 11a with an electrode pad (not shown) of the semiconductor chip 12. A gap between an inner wall of the opening 11a and the semiconductor chip 12 or the outer circumference of a beam-lead bonded portion is filled and shielded with a suitable shielding resin.

The respective semiconductor packages 10 have substantially the same structure even though the size and/or the type of the semiconductor chip 11 itself are different. These semiconductor packages are subjected to various performance tests before they are layered together as a multi-layered semiconductor device as shown in FIG. 1, to confirm that they pass the tests.

A connecting package or layer 17 includes a film-like substrate 11 of a resinous material, a circuit pattern 13 formed on a surface of the substrate, and a low melting point metal 14 filled in a through-hole 11b for electrically connecting upper and lower surfaces of the package to each other. Also, in the connecting layer 17, an opening 11c is provided in the substrate 11, for accommodating a semiconductor package or packages 10 of the above-described structure.

Similar to the semiconductor package 10, the connecting layer 17 is subjected to various performance tests before it is incorporated into a multi-layered semiconductor device, to confirm that it can pass the tests.

A base substrate 18 includes a substrate 19 of an insulation resinous material, circuit patterns 13 formed on upper and lower surfaces thereof, conductors 20 provided in through-holes 18a formed in the substrate 19, for interconnecting the upper and lower circuit patterns 13 with each other, external connector terminals 21 such as solder balls formed on the lower surface of the substrate 19, and an insulation protective film 22 covering the circuit patter 13 formed on the lower surface of the substrate 19.

The external connector terminal 21 is electrically connected to the circuit pattern 13 on the lower surface of the substrate 19 and, further, is electrically connected to the circuit pattern 13 on the upper surface of the substrate 19 via the conductors 20 formed in the through-holes 18a. The individual base substrate 18 is also subjected to various performance tests before it is incorporated into a multi-layered semiconductor device similar to the semiconductor package 10 and the connecting layer 17, to confirm that it can pass the tests.

The film-like insulation resinous substrate for forming the semiconductor package 10 or the connecting layer 17 is preferably a tape member, for example, of polyimide resin having a thickness in a range from 20 to 75 $\mu$m. The substrate 19 for the base substrate 18 is preferably of glass-polyimide resin and glass-epoxy resin, for example, having a thickness in a range from 50 to 120 $\mu$m, in general.

The circuit pattern 13 to be formed on the semiconductor package 10, the connecting layer 17 and the base substrate 18 may be formed by providing a copper foil having a thickness in a range from 10 to 30 $\mu$m on the substrate and patterning the same with known means such as etching or the like.

The circuit pattern 13 formed on the upper surface of the substrate 11 in the semiconductor package 10, particularly an extension thereof extending into the opening 11a, is a portion to be electrically connected to the semiconductor chip 12 by a beam lead bonding method. Therefore, to guarantee the secure bonding with the semiconductor chip 12, the extension is preferably plated with gold or tin.

The low melting point metal 14 to be filled in the through-hole 11b formed in the substrate 11 of the semiconductor package 10 or the connecting layer 17 is suitably an alloy such as solder. Since one side (upper side) of the through-hole 11b is closed with the circuit pattern 13, the electrical connection is obtained between the circuit pattern 13 and the low melting point metal 14 if the low melting point metal is filled in the through-hole 11b.

After the semiconductor packages 10, the connecting layers 17 and the base substrate 18 have been individually tested, the respective layers are formed as circuit boards with a required number of parts and layered together to complete a multi-layered semiconductor device as shown in FIG. 1.

Figure 2C:
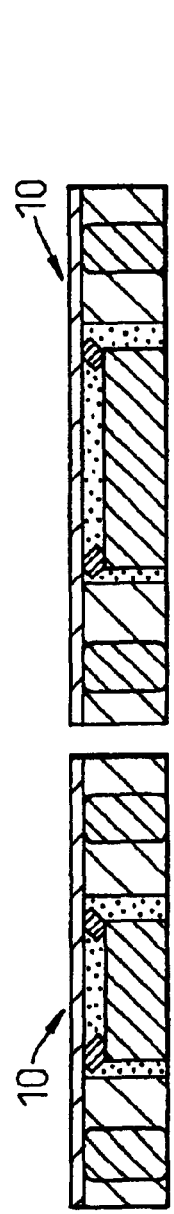
Figure 2D:
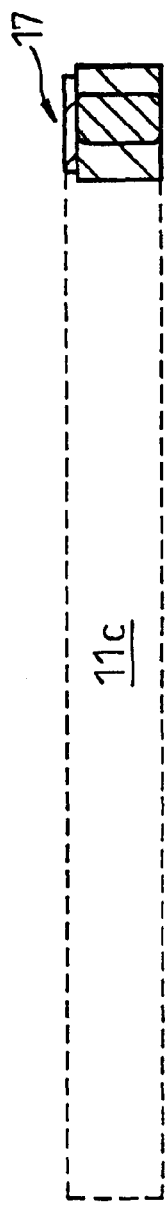

That is, the semiconductor package 10 shown in FIG. 2(a) is positioned in the opening 11c of the connecting layer shown in FIG. 2(b) to form a first layer (the uppermost layer) circuit board of the multi-layered semiconductor device shown in FIG. 1. A plurality of semiconductor packages 10 shown in FIG. 2(c) are positioned in the connecting opening 11c shown in FIG. 2(d) to form a second layer circuit board of the multi-layered semiconductor device shown in FIG. 1. A plurality of semiconductor packages 10 shown in FIG. 2(f) are positioned in a plurality of openings 11c in the connecting layer shown in FIG. 2(g) to form a fourth layer circuit board.

When the semiconductor packages 10 are positioned in the opening 11c of the connecting layer, a gap between the inner wall of the opening 11c and the outer circumference of the semiconductor package 10 is shielded with resin, if necessary. Then, on the base substrate 18 shown in FIG. 2(h), the fourth layer is placed, on which is placed a plurality of semiconductor packages 10 (to form a third layer), on which is placed the second layer, on which is placed the first layer.

Since the low melting point metal 14 filled in the through-hole 11b in the respective substrate 11 is bonded to circuit pattern 13 in the adjacent lower layer or the base substrate, the electrical connection between the adjacent layers can be established. When the layers are superposed on each other, a thermoplastic insulating adhesive, for example, may be preferably used in a region other than that providing an electrical connection.

Figure 3:
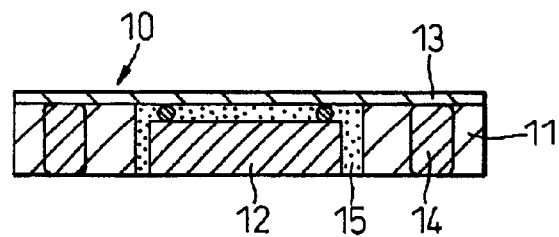
FIG. 3 is a sectional view of a semiconductor package obtained by flip-chip connection.

In the embodiment of the multi-layered semiconductor device or the semiconductor package 10 shown in FIG. 1 and FIGS. 2(a) to 2(b), the electrical connection between the semiconductor chip 12 and the circuit pattern 13 is made by the beam lead bonding method as described before. However, as shown in FIG. 3, the electrical connection between the semiconductor chip 12 and the circuit pattern 13 may be made by a flip-chip connecting method in all or part of the semiconductor packages in the multi-layered semiconductor device shown in FIG. 1.

Figure 4:
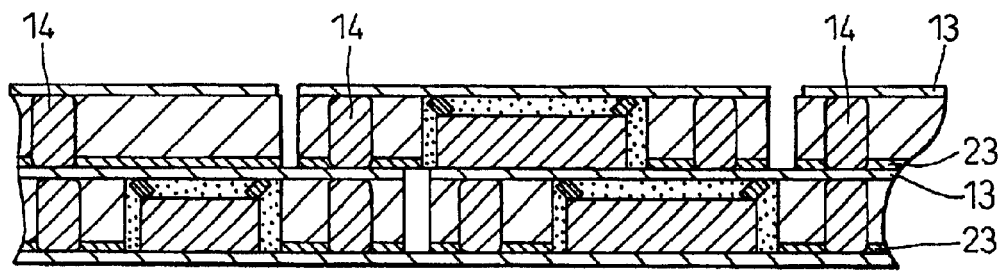
FIG. 4 is a partial sectional view of the multi-layered semiconductor device shown in FIG. 1.

FIG. 4 is a sectional view of part of the multi-layered semiconductor device shown in FIG. 1, wherein the interlayer coupling is carried out via the low melting point metal filled in the through-hole 11b of the substrate 11 when the respective layers are bonded together. That is, part of the low melting point metal (solder bump) 14 in the uppermost layer is directly bonded to the circuit pattern 13 in the second layer to be electrically conductive to each other. In this regard, reference numeral 23 in FIG. 4 denotes an adhesive.

Figure 5:
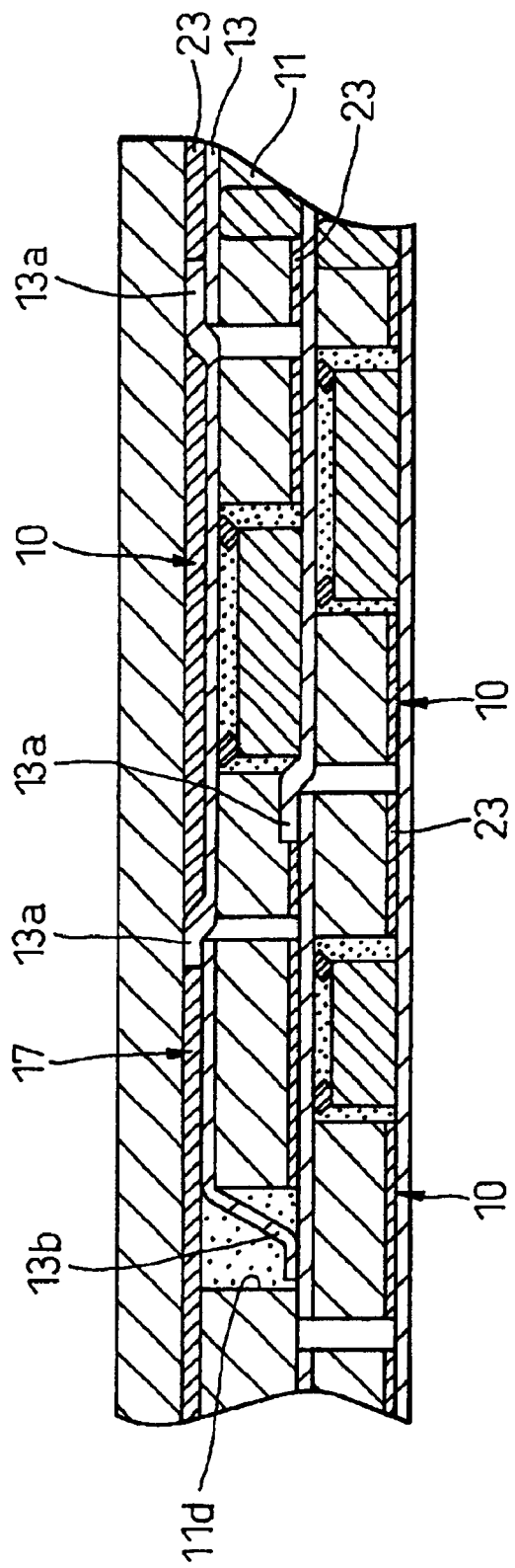
FIG. 5 is a sectional view of another embodiment according to the present invention corresponding to FIG. 4.

FIG. 5 is a sectional view corresponding to FIG. 4, wherein the electrical connection in the same layer or between different layers is made by the beam lead bonding in place of the low melting point metal (solder bump).

In FIG. 5, the circuit pattern 13 formed on the upper surface of the substrate 11 extends outward while exceeding the outer periphery of the upper surface of the semiconductor packages 10 in the second and third layers, which extension 13a is bonded by the beam lead bonding method to the circuit pattern 13 formed on the upper surface of the substrate 11 of the semiconductor package or the connecting layer 17 so that the electrical connection is established between the two.

In the connecting layer 17 which is a second layer as seen from above in FIG. 5, a through-hole 11d is provided in a substrate 11 thereof, and part of a circuit pattern 13 formed on the upper surface of the substrate 11 extends into an upper region of the through-hole 11d to form an extension 13b. This extension 13b is in contact and bonded to the circuit pattern 13 formed on the upper surface of a semiconductor package 10 in a third layer to establish the electrical connection between the second and third layers. Note that a portion in which both the layers are bonded together by the beam lead bonding method is preferably shielded with a shielding resin.

The electrical connection in the same layer or between different layers by the beam lead bonding method as described above may be carried out while using an exclusive tool (not shown). In this regard, it is convenient to plate the extension of the circuit pattern 13 on which the bonding is carried out in advance with gold or tin for facilitating the electrical bonding. While the interlayer connection is performed by the beam lead bonding method via the through-hole 11d formed in the connecting layer 17 in the embodiment shown in FIG. 5, it is also possible to provide a through-hole in the substrate 11 of the semiconductor package 10 in the same manner as above, through which the interlayer connection is established through the through-hole.

Figure 6:
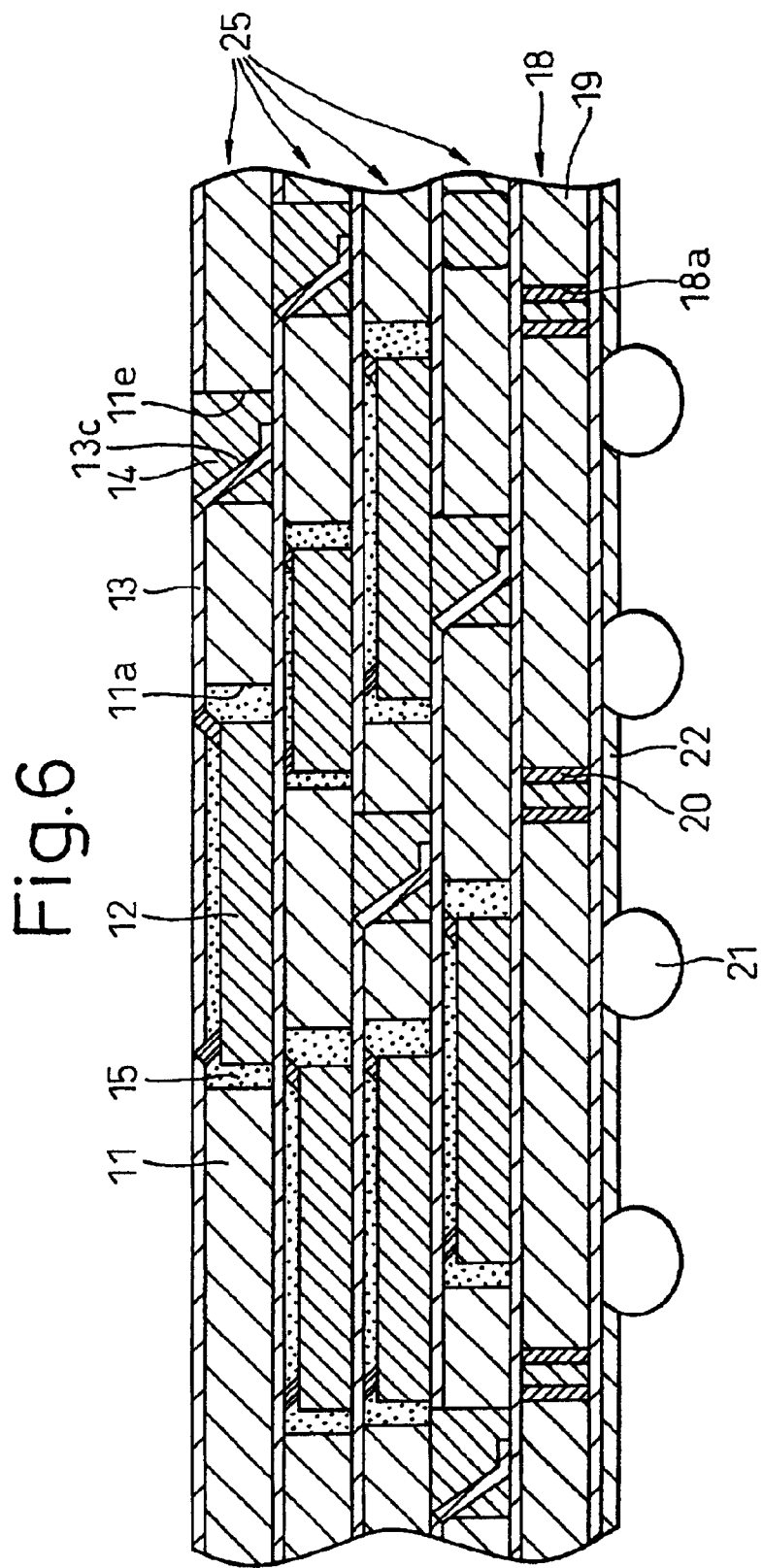
FIG. 6 is a sectional view of a multi-layered semiconductor device according to a further embodiment of the present invention.
Figure 7:
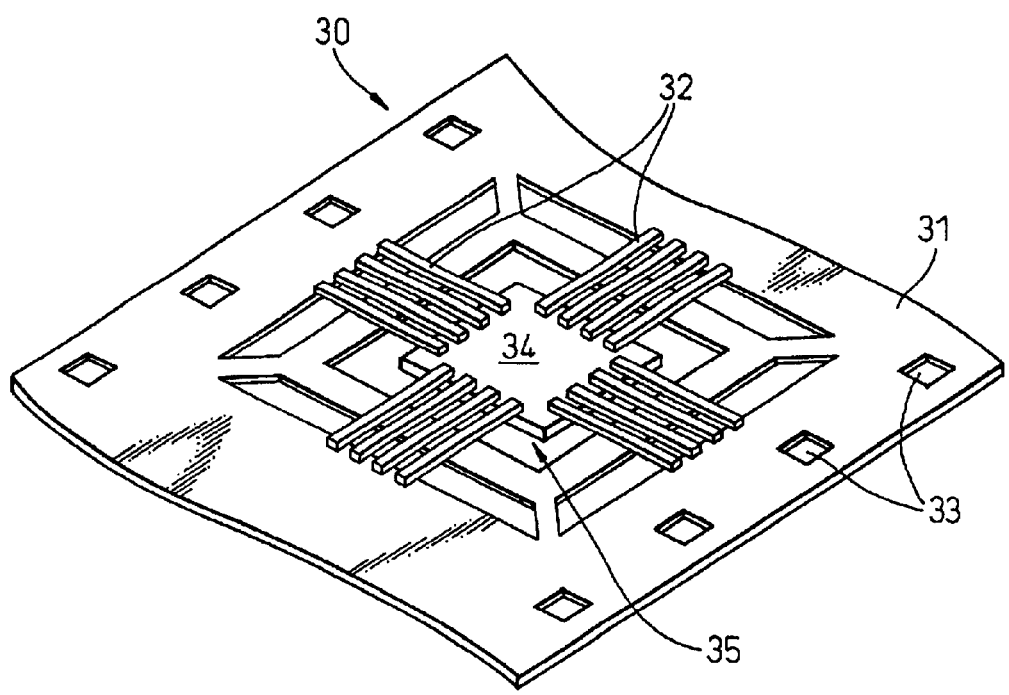
FIG. 7 is a perspective view showing a structure of a prior art semiconductor device.
Figure 8:
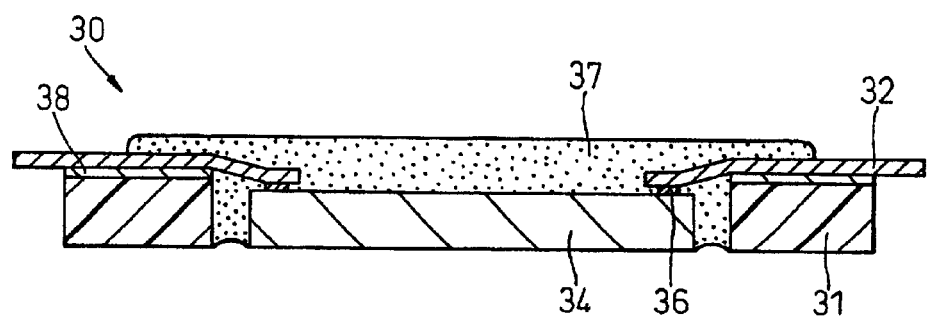
FIG. 8 is a sectional view of a connecting part of a chip of the semiconductor device shown in FIG. 7.

FIG. 6 is a sectional view of a further embodiment of a multi-layered semiconductor device according to the present invention, wherein each circuit board 25 includes a film-like substrate 11 of resinous material, a semiconductor chip 12 accommodated in an opening 11a of this substrate, and a circuit pattern 13 formed on a surface of the substrate.

The electrical connection between the circuit pattern 13 and the semiconductor chip 12 is carried out by connecting the extension of the circuit pattern 13 extending into the opening 11a with an electrode pad (not shown) of the semiconductor chip 12 by using the beam lead bonding method. Although not illustrated, the semiconductor chip 12 may be electrically connected with the circuit pattern 13 by the flip-chip connecting method as shown in FIG. 3.

A through-hole 11e is formed through the substrate 11 between upper and lower surfaces thereof, into which extends an extension of the circuit pattern 13 formed on the upper surface of the substrate 11. This extension 13c is brought into contact with the circuit pattern 13 formed on an upper surface of a substrate 11 of a circuit board 25 disposed beneath the through-hole 11e by means of beam lead bonding and is bonded to circuit pattern 13 to establish the interlayer electrical connection.

A lowermost base substrate 18 in the multi-layered semiconductor device shown in FIG. 6 has a same structure as the lowermost base substrate 18 of the multi-layered semiconductor device shown in FIG. 1. To produce the multi-layered semiconductor device shown in FIG. 6, the base substrate 18 and the circuit boards 25 of the respective layers are subjected to tests in advance to confirm that they can pass the tests. Thereafter, the respective circuit boards 25 are sequentially layered on the base substrate 18. As described before, the interlayer connection is carried out during the superposition by bonding the circuit patterns 13 with each other via the through-hole 11e by means of the beam lead bonding of the extension 13c of the circuit pattern 13. The interior of the opening 11a in which the semiconductor chip 12 is accommodated and the through-hole 11e through which the beam lead bonding is carried out are preferably shielded with a resin 15, if necessary.

In the multi-layered semiconductor device shown in FIG. 6, the interlayer connection between the adjacent circuit boards 25, of course, may be performed via a low melting point metal 14 by filling the predetermined through-holes 11b of the circuit boards 25 with the low melting point metal 14 as described before. Also, in the same manner as in the preceding embodiment, an adhesive may be used between the adjacent layers during the superposition of the respective circuit boards.

What is claimed is:

1. A multi-layered semiconductor device characterized in that a film-like semiconductor package incorporating therein a semiconductor chip is disposed in a package accommodation opening of a circuit pattern layer to form a circuit board, said circuit pattern layer comprises a substrate, a circuit pattern formed on the substrate, and said package accommodation opening, and a plurality of such circuit boards are layered together to electrically connect said circuit patterns of the respective circuit boards with each other, wherein the electrical connection between the circuit patterns on the respective circuit boards is performed via a low melting point metal filled in a through-hole formed in the semiconductor package or the circuit board, and the electric connection between the semiconductor package and a circuit pattern layer accommodating the semiconductor package is performed by connecting an extension of the circuit pattern, formed on the semiconductor package to project outside the package, with an electrode pad of the circuit pattern layer.

2. A multi-layered semiconductor device as defined by claim 1, wherein every adjacent circuit board is bonded to another with an insulation adhesive except for an electrically connected portion.

3. A multi-layered semiconductor device as defined by claim 1, wherein the electrical connection between the circuit patterns on the respective circuit boards is performed by connecting an extension of the circuit pattern into a hole formed in the semiconductor package or the circuit board with an electrode pad of the circuit pattern in the other circuit board positioned beneath the former circuit board.

4. A multi-layered semiconductor device formed of a plurality of circuit boards layered together, each circuit board comprising an insulation substrate, a semiconductor chip incorporated in the substrate, a circuit formed on the surface of the substrate and connected to the semiconductor chip, characterized in that a lead extending from one of the circuit boards of the plurality of circuit boards is bonded to a circuit on another circuit board disposed beneath the former circuit board to establish an interlayer connection, said lead extending through a through-hole in the insulation substrate of the former circuit board, wherein at least one of the plurality of circuit boards incorporates a plurality of semiconductor chips therein.

5. A multi-layered semiconductor device as defined by claim 4, wherein every adjacent circuit board is bonded to another with an insulation adhesive.

6. A multi-layered semiconductor device as defined by claim 4, wherein the semiconductor chip is accommodated in a through-hole formed in the insulation substrate of at least one of the plurality of circuit boards, and is electrically connected to the circuit of the circuit board by a beam lead bonding.

7. A multi-layered semiconductor device as defined by claim 4, wherein the semiconductor chip is accommodated in a through-hole formed in the insulation substrate of at least one of the plurality of circuit boards, and is electrically connected to the circuit of the circuit board and the semiconductor chip by a flip-chip connection.

8. A multi-layered semiconductor device as defined by claim 4, wherein the circuit on the circuit board is electrically connected, by means of a low melting point metal filled in a through-hole provided in the insulation substrate of the circuit board, to a circuit on an adjacent circuit board to establish an interlayer connection.

* * * * *